United States Patent
Tsubuku et al.

(10) Patent No.: US 9,087,744 B2
(45) Date of Patent: Jul. 21, 2015

(54) SEMICONDUCTOR DEVICE AND METHOD FOR DRIVING TRANSISTOR

(75) Inventors: Masashi Tsubuku, Atsugi (JP); Kengo Akimoto, Atsugi (JP)

(73) Assignee: Semiconductor Energy Laboratory Co., Ltd., Atsugi, Kanagawa-ken (JP)

( * ) Notice: Subject to any disclaimer, the term of this patent is extended or adjusted under 35 U.S.C. 154(b) by 599 days.

(21) Appl. No.: 13/282,505

(22) Filed: Oct. 27, 2011

(65) Prior Publication Data

US 2012/0112045 A1 May 10, 2012

(30) Foreign Application Priority Data

Nov. 5, 2010 (JP) ................................ 2010-248094

(51) Int. Cl.
*G06F 3/038* (2013.01)
*H01L 27/12* (2006.01)
(Continued)

(52) U.S. Cl.
CPC ............ *H01L 27/1225* (2013.01); *G06F 3/038* (2013.01); *G09F 9/30* (2013.01); *G02F 1/1368* (2013.01); *G09G 3/3648* (2013.01); *G09G 2360/142* (2013.01)

(58) Field of Classification Search
CPC ....... G02F 1/133; G02F 1/1368; G02F 3/042; G02F 3/041; G02F 3/0386; G02F 3/0388; H01L 31/08; H01L 29/786; H03K 17/687
USPC .......... 250/214.1, 214 R, 214 LS, 239, 208.1; 348/307, 308, 309, 842; 257/207, 208, 257/210, 249, 250, 294, 329–332, 340, 343, 257/346, 365, 366, 368, 369, 387, 389, 392, 257/393, 394, 43, 59; 327/530, 534, 535, 327/540, 541, 545; 438/30, 96, 161, 315, 438/316
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Inoue.T et al., "New construction of photoconductivity and its spectral response in amorphous In-Ga-Zn-O," AM-FPD '10 digest of technical papers, 2010, pp. 33-36.
(Continued)

*Primary Examiner* — Georgia Y Epps
*Assistant Examiner* — Don Williams
(74) *Attorney, Agent, or Firm* — Eric J. Robinson; Robinson Intellectual Property Law Office, P.C.

(57) ABSTRACT

When a positive bias voltage is applied to a gate electrode of a transistor including an oxide semiconductor for longer than or equal to 10 msec, electric characteristics of the transistor, which have varied due to the light irradiation, can be brought to the state which is substantially the same as the state before the light irradiation. Note that a positive bias voltage is applied to the gate electrode of the transistor at an appropriate timing with reference to the amount of incident light received by the transistor. Accordingly, a display device in which a reduction in display quality is suppressed even when light irradiation is performed can be realized.

18 Claims, 11 Drawing Sheets

(51) Int. Cl.

| | |
|---|---|
| *G09F 9/30* | (2006.01) |
| *G02F 1/1368* | (2006.01) |
| *G09G 3/36* | (2006.01) |

(56) References Cited

U.S. PATENT DOCUMENTS

| | | | |
|---|---|---|---|
| 5,920,092 A * | 7/1999 | Watanabe | 257/292 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0295041 A1 | 11/2010 | Kumomi et al. | |
| 2011/0175674 A1 * | 7/2011 | Shimizu et al. | 327/537 |
| 2012/0061666 A1 * | 3/2012 | Inoue et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-202106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8,9, and 16) in the In2O3-ZnGa2O4-ZnO Systems,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transitors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31 , 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; FE; GA; OR AL; B; MG: MN; FE; NI; CU;OR ZN] at temperature over 1000° C, ", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A. (Physical Review.A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Dislpays,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

Application time 500msec

Application time 100msec

Application time 10msec

Application time 1msec

Application time 100 $\mu$ sec

Application time 10 $\mu$ sec

SEMICONDUCTOR DEVICE AND METHOD FOR DRIVING TRANSISTOR

BACKGROUND OF THE INVENTION

1. Field of the Invention

The present invention relates to a semiconductor device using a transistor including an oxide semiconductor and a method for driving the transistor.

2. Description of the Related Art

Although transistors including amorphous silicon have been used for conventional display devices typified by liquid crystal televisions, an oxide semiconductor has attracted attention as a material which replaces a silicon semiconductor in order to form transistors. For example, an active matrix display device, in which an amorphous oxide including In, Ga, and Zn is used for an active layer of a transistor and the electron carrier concentration of the amorphous oxide is lower than $10^{18}/cm^3$, is disclosed (see Patent Document 1).

However, some problems of a transistor including an oxide semiconductor have been pointed out. One of the problems is the stability of the characteristics, and it is pointed out that the electric characteristics of the transistor are varied by irradiation with visible light and ultraviolet light.

REFERENCE

[Patent Document 1] Japanese Published Patent Application No. 2006-165528

SUMMARY OF THE INVENTION

An object of one embodiment of the present invention is to provide a method in which, even when electric characteristics of a transistor have varied due to light irradiation, the electric characteristics are brought to the state which is substantially the same as the state before the light irradiation.

In addition, another object of one embodiment of the present invention is to provide a display device in which a reduction in display quality is suppressed even when light irradiation is performed.

According to one embodiment of the present invention, a semiconductor device includes a transistor including an oxide semiconductor layer overlapping a gate electrode with a gate insulating layer interposed therebetween, and a driving circuit for applying a positive voltage to the gate electrode for longer than or equal to 100 μsec.

According to another embodiment of the present invention, a semiconductor device includes a transistor including an oxide semiconductor layer overlapping a gate electrode with a gate insulating layer interposed therebetween, and a driving circuit for applying a positive voltage to the gate electrode for longer than or equal to 100 μsec when the transistor is in an off-state.

According to another embodiment of the present invention, a semiconductor device includes a transistor including an oxide semiconductor layer overlapping a gate electrode with a gate insulating layer interposed therebetween, and a driving circuit for applying a positive voltage to the gate electrode for longer than or equal to 100 μsec when the transistor is shielded from light for bringing a threshold voltage of the transistor to a value substantially the same as a threshold voltage before light irradiation.

In addition, according to another embodiment of the present invention, in the semiconductor device, the amount of variation in electric characteristics of the transistor due to light irradiation is made smaller or zero by a driving circuit.

According to another embodiment of the present invention, a semiconductor device includes a transistor including an oxide semiconductor layer overlapping a gate electrode with a gate insulating layer interposed therebetween, an optical sensor, and a driving circuit for applying a positive voltage to the gate electrode when the optical sensor detects turning off of light.

According to another embodiment of the present invention, a semiconductor device includes a transistor including an oxide semiconductor layer overlapping a gate electrode with a gate insulating layer interposed therebetween, an optical sensor, and a driving circuit for applying a positive voltage to the gate electrode when the optical sensor detects turning on of light.

In the above, it is preferable that the optical sensor can detect the light including energy which is higher than or equal to a band gap of the oxide semiconductor layer.

According to another embodiment of the present invention, in a method for driving a transistor, the transistor which includes an oxide semiconductor layer as a channel formation region and a gate electrode overlapping the oxide semiconductor layer with a gate insulating layer interposed therebetween is irradiated with light, so that a threshold voltage is shifted to a negative side; and a positive voltage is applied to the gate electrode for longer than or equal to 100 μsec without applying a voltage to a source electrode and a drain electrode, so that the threshold voltage is brought to a state substantially the same as a threshold voltage before the light irradiation.

In addition, according to another embodiment of the present invention, in a method for driving the transistor, a transistor which includes an oxide semiconductor layer as a channel formation region and a gate electrode overlapping the oxide semiconductor layer with a gate insulating layer interposed therebetween is irradiated with light, so that a threshold voltage is shifted to a negative side; and a positive voltage is applied to the gate electrode for longer than or equal to 100 μsec without applying a voltage to a source electrode and a drain electrode when the transistor is in an off-state, so that the threshold voltage is brought to a state substantially the same as a threshold voltage before the light irradiation.

In addition, according to another embodiment of the present invention, in a method for driving a transistor, the transistor which includes an oxide semiconductor layer as a channel formation region and a gate electrode overlapping the oxide semiconductor layer with a gate insulating layer interposed therebetween is irradiated with light, so that a threshold voltage is shifted to a negative side; and a positive voltage is applied to the gate electrode for longer than or equal to 100 μsec without applying a voltage to a source electrode and a drain electrode when the transistor is shielded from light, so that the threshold voltage is brought to a state substantially the same as a threshold voltage before the light irradiation.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are simply used for convenience of explanation.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that "photocurrent" in this specification refers to current that flows through a transistor in which electric characteristics are varied due to light irradiation. However, as a matter of convenience, "photocurrent" can also be used to denote current without light irradiation.

Note that "without applying a voltage to a source electrode and a drain electrode" means not only a state where a voltage is not applied to the source electrode and the drain electrode but also a state where 0 V or approximately 0 V (i.e. 0.1 V) is applied to the source electrode and the drain electrode.

According to one embodiment of the present invention, a method for driving a transistor, in which, even when electric characteristics of a transistor have varied due to light irradiation, the electric characteristics are brought to the state which is substantially the same as the state before the light irradiation, can be obtained.

DETAILED DESCRIPTION OF THE INVENTION

Embodiments and an example of the present invention will be described below in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments and example below.

Embodiment 1

Light irradiation can be given as one of factors for variation in electric characteristics of a transistor including an oxide semiconductor. The photoresponse characteristics of a transistor including an oxide semiconductor layer after turning off the light shows decay of photocurrent which includes two phases. This phenomenon is explained as a result of the existence of a "safe" trap Es close to the conduction band Ec or the valence band Ev.

Figure 1A:
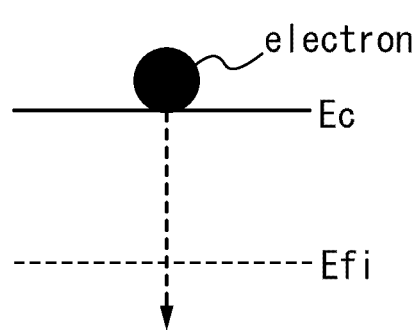
FIGS. 1A and 1B are schematic diagrams of a "safe" trap.
Figure 1B:
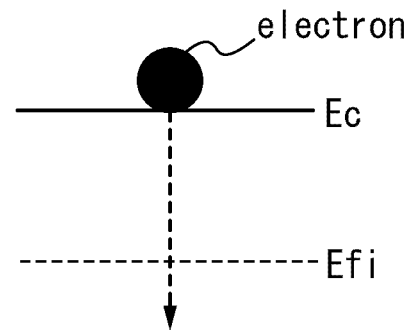
Figure 1B:
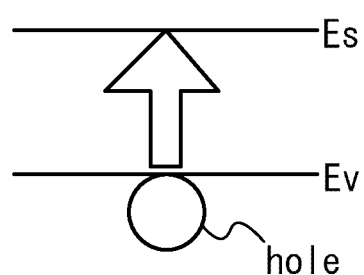
Figure 1B:
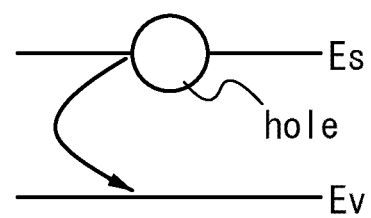

The "safe" trap Es which exists close to the valence band Ev will be described with reference to FIGS. 1A and 1B. In general, when a semiconductor is irradiated with light having an energy of greater than or equal to the band gap, electrons and holes are generated. In addition, a recombination of the electron with the hole occurs in a process of releasing energy. However, as illustrated in FIG. 1A, the "safe" trap Es exists closer to the valence band Ev than the intrinsic Fermi level Efi in the band gap of an oxide semiconductor. The recombination of electrons with holes does not easily occur due to the existence of the "safe" trap Es. This is because, as illustrated in FIG. 1B, holes return to the valence band Ev before the recombination of the electron with the hole occurs in the "safe" trap Es. Further, the carrier density in the "safe" trap Es tends to be high. When a hole is once trapped by the "safe" trap Es which exists close to the valence band Ev, it is difficult for the hole to escape from the "safe" trap Es to the valence band Ev. In other words, the "safe" trap Es is a trap in which recombination does not easily occur and carrier density is easily increased.

Photoresponse characteristics of an oxide semiconductor where such a "safe" trap Es exists are analyzed in two phases of first photoresponse and second photoresponse. The first photoresponse is rapid decrease of the photocurrent after light irradiation. The existence of a shallow trap in the band gap mainly contributes to the first photoresponse. In the case where a shallow trap exists, the recombination of electrons with holes easily occurs and, with excess carriers, photoresponse characteristics are easily and rapidly relaxed to an equilibrium state before light irradiation. On the other hand, the second photoresponse is slow decrease of the photocurrent after light irradiation. The existence of the "safe" trap Es mainly contributes to the second photoresponse. Carriers cannot follow the recombination process and thus carriers left behind remain in the "safe" trap Es as fixed carriers for a long time. Accordingly, the trap density is increased. This leads to delay in decay of photocurrent and fluctuation in threshold voltage. In other words, the behavior of electrons and holes differs depending on kinds of trap, and the probability that carriers are recombined and the proportion of trapping in each trap are important in photoresponse characteristics.

In other words, in a transistor including an oxide semiconductor, the second photoresponse in photoresponse characteristics is a factor for variation in electric characteristics of the transistor. Specifically, the second photoresponse is immediate cause for variation in electric characteristics, in which the value of photocurrent after light irradiation is not brought to the value of photocurrent before the light irradiation and thus fluctuation in threshold voltage occurs between before and after the light irradiation.

However, when a positive bias voltage is applied to a gate electrode of a transistor including an oxide semiconductor, electric characteristics of the transistor, which have varied due to light irradiation, can be brought to the state which is substantially the same as the state before the light irradiation.

Measurement results of photoresponse characteristics of a transistor including an oxide semiconductor, which includes two phases, are shown with reference to FIG. 2, FIGS. 3A and 3B, and FIGS. 4A to 4C.

Figure 5:
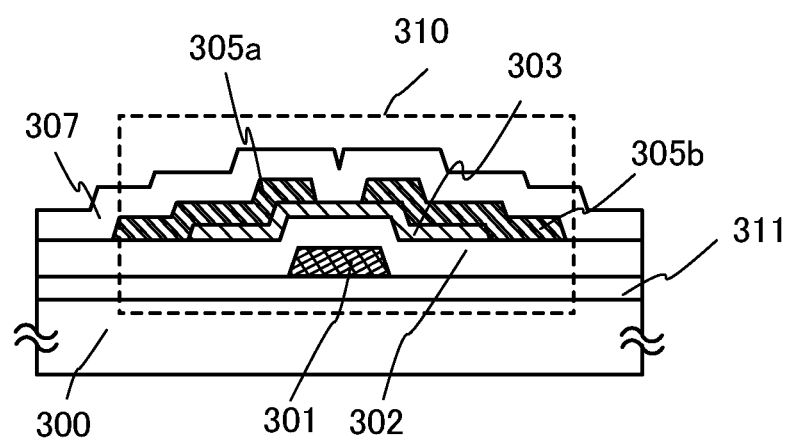
FIG. 5 illustrates a cross-sectional structure of a transistor.

Here, an example of a transistor used for the measurement will be described with reference to FIG. 5. Note that there is no particular limitation on the structure of the transistor. The transistor shown in FIG. 5 is an inverted-staggered thin film transistor 310 which is one of bottom-gate structures and is referred to as a channel-etched type. The transistor 310 includes, over a glass substrate 300, a base film 311, a gate electrode layer 301, a gate insulating layer 302, an oxide semiconductor layer 303, a source electrode layer 305a, a drain electrode layer 305b, and an insulating layer 307.

The channel length (L) is 30 μm, the channel width (W) is 10000 μm, and the source electrode layer 305a and the drain electrode layer 305b have a comb shaped structure. In addition, the length in which the source electrode layer 305a and the gate electrode layer 301 overlap each other and the length in which the drain electrode layer 305b and the gate electrode layer 301 overlap each other are not particularly limited.

First, an insulating film which serves as the base film 311 is formed over the glass substrate 300 having an insulating surface, whose size is 126.6 mm square. As the base film 311, a silicon nitride film with a thickness of 100 nm and a silicon oxynitride film with a thickness of 150 nm are sequentially stacked.

Then, the gate electrode layer 301 is formed over the base film 311. As the gate electrode layer 301, a tungsten film with a thickness of 100 nm is formed to have a single layer. Note that end portions of the gate electrode layer 301 have a tapered shape. Here, a taper angle is, for example, greater than or equal to 30° and less than or equal to 60°. Note that a "taper angle" means an inclination angle formed by a side surface and a bottom surface of a layer having a tapered shape (e.g., the gate electrode layer 301) when being observed in a direction perpendicular to the cross section (a plane which is perpendicular to the surface of the substrate). Further, the gate insulating layer 302 is formed over the gate electrode layer 301. As the gate insulating layer 302, a silicon oxynitride film with a thickness of 100 nm is formed to have a single layer.

Next, an In—Ga—Zn—O film is formed to a thickness of 35 nm by a sputtering method with the use of an oxide target having a composition ratio of $In_2O_3$: $Ga_2O_3$: $ZnO=1:1:2$ [molar ratio] over the glass substrate. The In—Ga—Zn—O film is deposited at 200° C., and the sputtering is performed at input DC power of 5 kW and the total gas pressure of 0.6 Pa.

After that, heat treatment is performed at 450° C. under a nitrogen atmosphere for 1 hour. This heat treatment is preferably performed in an atmosphere of nitrogen or a rare gas such as helium, neon, or argon in which water, hydrogen, or the like is not contained; for example, the dew point is lower than or equal to −40° C., more preferably lower than or equal to −60° C. It is preferable that the purity of nitrogen or the rare gas such as helium, neon, or argon which is introduced into a heat treatment apparatus be set to be 6N (99.9999%) or higher, preferably 7N (99.99999%) or higher (that is, the concentration of impurities is 1 ppm or lower, preferably 0.1 ppm or lower).

After the heat treatment, a stacked conductive film is formed by sequentially stacking a titanium film with a thickness of 100 nm, an aluminum film with a thickness of 400 nm, and a titanium film with a thickness of 100 nm by a sputtering method.

Next, through a photolithography process, a resist mask is formed over the stacked conductive film and selective etching is performed to form the source electrode layer 305a and the drain electrode layer 305b, and then the resist mask is removed. After that, heat treatment is performed at 300° C. under a nitrogen atmosphere for 1 hour.

Next, by a sputtering method using a silicon oxide target, a silicon oxide film with a thickness of 400 nm is formed over the source electrode layer 305a and the drain electrode layer 305b. Note that the film formation conditions of the silicon oxide film are as follows: the flow rate of $O_2$ is 50 sccm; the total gas pressure is 0.4 Pa; the substrate temperature is 100° C.; the deposition rate is 6.5 nm/min; and the sputtering power is 1.5 kW. After that, heat treatment is performed at 300° C. under a nitrogen atmosphere for 1 hour.

Figure 2:
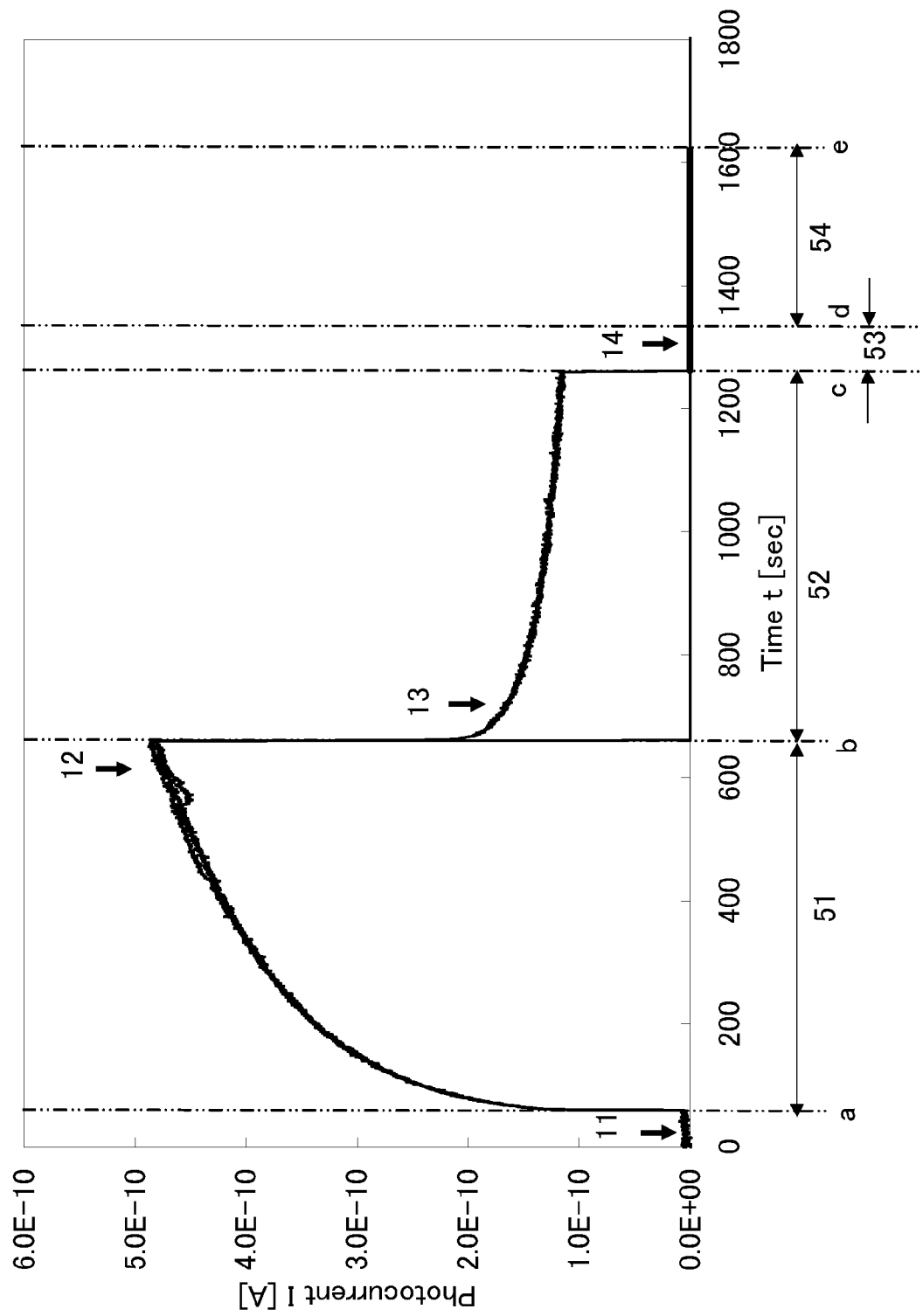
FIG. 2 is a graph of photoresponse characteristics.

The photoresponse characteristics are measured using the above transistor 310. FIG. 2 shows measurement results of photoresponse characteristics (photocurrent-time characteristics) between before and after light irradiation. In FIG. 2, the vertical axis represents the photocurrent, and the horizontal axis represents time. Note that as shown in FIG. 2, the photoresponse characteristics will be described by being divided into a first period 51, a second period 52, a third period 53, and a fourth period 54. In the first period 51, the transistor is irradiated with light without application of a bias voltage. In the second period 52, the light is turned off without application of a bias voltage. In the third period 53, the light is turned off and a positive bias voltage is applied. In the fourth period 54, the light is turned off without application of a bias voltage. Note that in this specification, "a bias voltage is applied" means that "a bias voltage is applied to a gate electrode of a transistor including an oxide semiconductor".

In FIG. 2, a denotes a time when the light irradiation is started; b, a time when the turning off of the light is started; c, a time when application of a positive bias voltage is started (while the light is turned off); d, a time when application of the positive bias voltage is completed (while the light is turned off); and e, a time when the measurement is completed.

The first period 51 lasts for 600 seconds, the second period 52 lasts for 600 seconds, the third period 53 lasts for 60 seconds, and the fourth period 54 lasts for 300 seconds. In other words, the total time from the time a when light irradiation is started to the time e when the measurement is completed is 1560 seconds. In the first period 51, the light irradiation is performed from the portion of the transistor 310 which is to be measured, which is not shielded from light, that is, the light irradiation is performed from the opposite side of the gate electrode. Note that in the case where the gate electrode is transparent, the light irradiation may be performed from the gate electrode side. The light irradiation intensity is 3.5 mW/cm$^2$, and light having a wavelength of 400 nm, which is dispersed using a xenon light source and an optical filter. In the third period 53, a positive bias voltage +20 V is applied. In the measurement of photocurrent, 0 V and 0.1 V are applied to the source electrode and the drain electrode, respectively.

The value of the photocurrent in the first period 51 is gradually increased over time. In other words, it is found that, in the case where light irradiation is performed so as to correspond to transition of electrons from the valence band to the conduction band, the value of photocurrent increases as the length of the light irradiation time gets longer.

It is found that the value of photocurrent in the second period 52 is relatively small as compared to the value of photocurrent in the light irradiation period (the first period 51), and further, the value is gradually decreased over time. However, when the value of photocurrent immediately before the first period 51 and the value of photocurrent in the second period 52 are compared, there is a difference. That is, it is found that the value of photocurrent after light irradiation is not brought to the value of photocurrent before the light irradiation even after the light is turned off.

The value of photocurrent in the third period 53 is substantially zero. When the value of photocurrent immediately before the first period 51 and the value of photocurrent immediately after the third period 53 are compared, both the values are almost equal. In other words, it is found that the value of photocurrent after light irradiation is brought to the value of photocurrent before the light irradiation by applying a positive bias voltage after the light is turned off. Note that although not illustrated in FIG. 2, the value of photocurrent after light irradiation is brought to the value of photocurrent before the light irradiation by applying a positive bias voltage during the light irradiation.

The value of photocurrent in the third period 53 still remains in the fourth period 54. In other words, it is found that, when a positive bias voltage is once applied, the value of photocurrent before light irradiation remains after the light irradiation even when the application of the positive bias voltage is stopped.

The above measurement results show that, when a positive bias voltage is once applied, the value of photocurrent after light irradiation can be brought to the value of photocurrent before the light irradiation, regardless of whether light is turned off or regardless of whether application of a positive bias voltage is performed or whether the application is stopped in later steps.

That is, when a positive bias voltage is applied, the value of photocurrent after light irradiation, which has been gradually decreased due to the second photoresponse, can be instantaneously brought to the value of photocurrent before the light irradiation. Further, when the value of photocurrent is once brought to the value of photocurrent before light irradiation, the value remains until the transistor is irradiated again with light. Thus, the value of photocurrent can be refreshed, and improvement of the following photoresponse characteristics can be regarded: the value of photocurrent after the light irradiation, which is one of factors for variation in electric characteristics of the transistor, is not brought to the value of photocurrent before the light irradiation.

FIGS. 3A and 3B and FIGS. 4A to 4C show measurement results of electric characteristics at points 11 to 14 of the photoresponse characteristics (photocurrent-time characteristics) shown in FIG. 2. A transistor used to obtain the measurement results of FIGS. 3A and 3B and FIGS. 4A to 4C is similar to the transistor used to obtain the measurement results of FIG. 2.

Figure 3A:
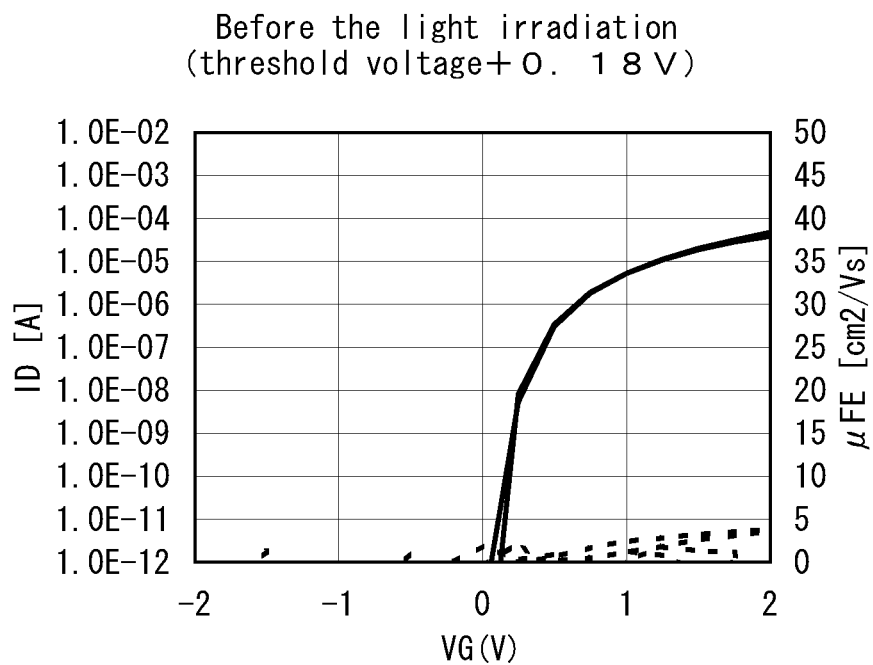
FIGS. 3A and 3B are graphs of photoresponse characteristics.
Figure 3B:
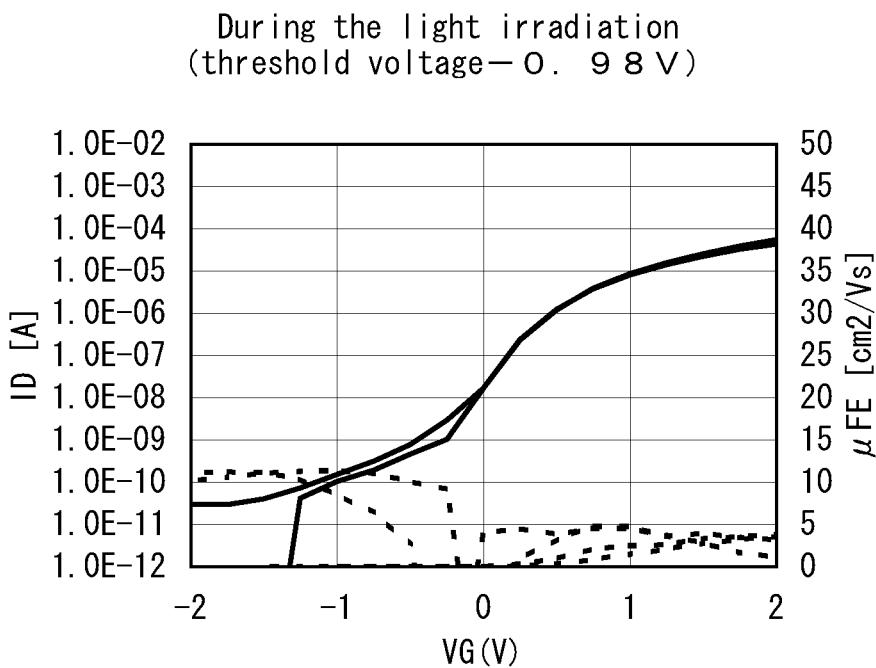

FIG. 3A shows measurement results of electric characteristics at the point 11, where the light is not irradiated, and FIG. 3B shows measurement results of electric characteristics at the point 12, where the light is irradiated. It is found that variation in threshold voltage occurs between before and after the light irradiation. The threshold voltage shifts from +0.18 V to −0.98 V. When the light irradiation time gets longer, the value of photocurrent increases and the threshold voltage shifts to a negative direction. Therefore, the electric characteristics of the transistor become unstable.

Note that a method for calculating a threshold voltage described in this specification is as follows. A correlation between the gate voltage which is represented in the x-axis and the square root of a drain current in a saturation region, which is represented in the y-axis, is approximated to a line, and an intersection of the line and the x-axis is defined as a threshold voltage. Note that the above method for calculating a threshold voltage is a mere example and, without limitation thereto, a threshold voltage can be obtained by another method.

Figure 4A:
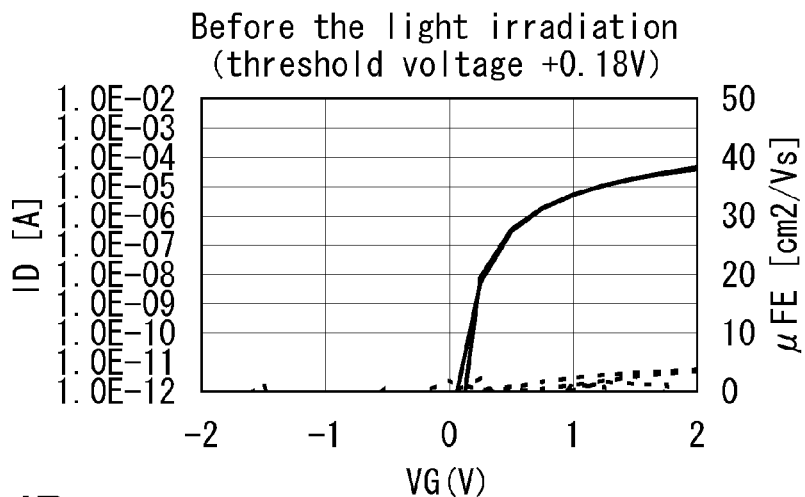
FIGS. 4A to 4C are graphs of photoresponse characteristics.
Figure 4B:
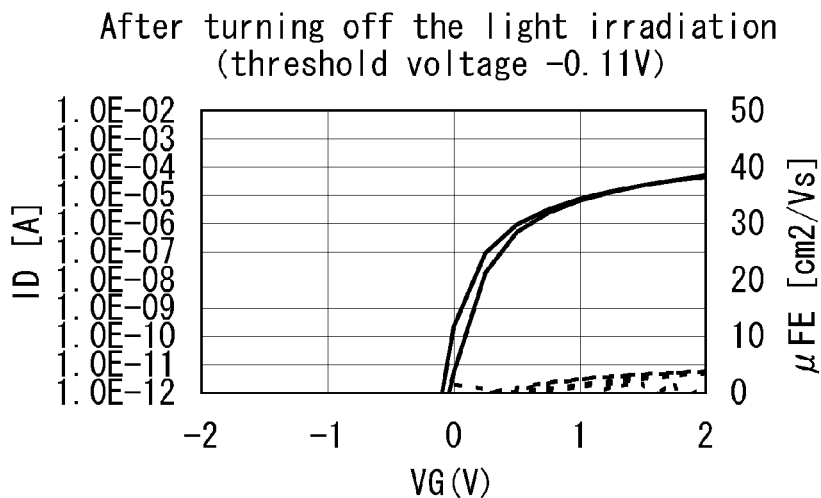
Figure 4C:
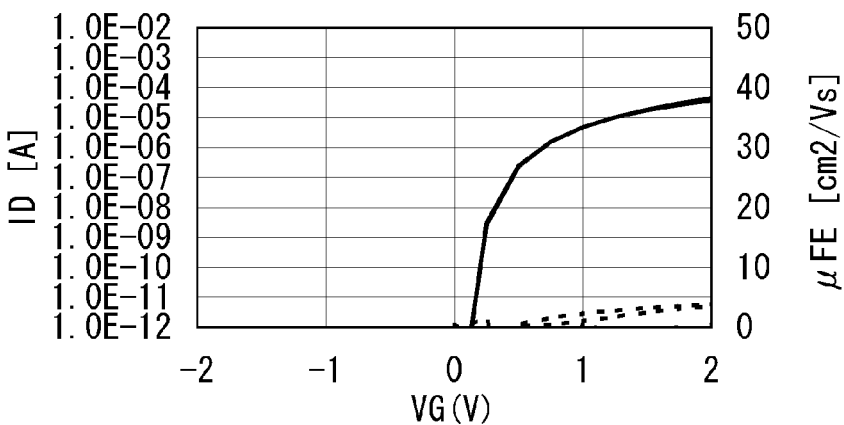

FIG. 4A shows measurement results of electric characteristics at the point 11, where the light is not irradiated, FIG. 4B shows measurement results of electric characteristics at the point 13, where the light was turned off after the light irradiation, and FIG. 4C shows measurement results of electric characteristics at the point 14, where the positive bias voltage was applied after the light irradiation.

When FIG. 3B and FIG. 4B are compared, it is found that fluctuation in threshold voltage is slightly recovered. However, when FIGS. 4A and 4B are compared, the fluctuation of the threshold voltage is a great difference (approximately 0.3 V). That is, it is extremely difficult to bring the threshold voltage which has once fluctuated due to the light irradiation to the threshold voltage before the light irradiation, and it is found that the fluctuation in threshold voltage is not recovered even when light is turned off.

When FIG. 4A and FIG. 4C are compared, extremely interesting results can be obtained. The level of the threshold voltage after application of the positive bias voltage in FIG. 4C is equivalent to the level of the threshold voltage before the light irradiation in FIG. 4A. In other words, it is found that the fluctuation in threshold voltage which has been hardly brought to the threshold voltage before the light irradiation when the light is turned off can be recovered by applying the positive bias voltage.

The above measurement results show that, when a positive bias voltage is once applied, the fluctuation in threshold voltage can be recovered even when large fluctuation in threshold voltage occurs due to light irradiation, regardless of whether the transistor is irradiated with light and whether the light is turned off or regardless of whether application of a positive bias voltage is performed or whether the application is stopped in later steps.

That is, when a positive bias voltage is applied, the threshold voltage after the light irradiation, which has fluctuated due to the second photoresponse, can be instantaneously brought to the threshold voltage before the light irradiation. Even when the transistor is irradiated with light after the fluctuation in threshold voltage is recovered and fluctuation in threshold voltage occurs again, the fluctuation is recovered every time a positive bias voltage is applied. Thus, the threshold voltage can be refreshed, and improvement of the following photoresponse characteristics can be regarded: fluctuation in threshold voltage occurs between before and after the light irradiation, which is one of factors for variation in electric characteristics of the transistor.

Thus, when a positive bias voltage is applied to a gate electrode of a transistor including an oxide semiconductor, electric characteristics of the transistor, which have varied as described above due to light irradiation, can be brought to the state which is substantially the same as the state before the light irradiation.

Note that the timing at which a positive bias voltage is applied is not particularly limited. Thus, the positive bias voltage may be applied at an appropriate timing, for example, while a transistor is irradiated with light or while the light is turned off. As the length of the light irradiation time gets longer, electric characteristics of a transistor including an oxide semiconductor become unstable. However, a positive bias voltage can be applied at an appropriate timing and the electric characteristics of the transistor, which have varied due to light irradiation every time the positive bias voltage is applied, can be brought to the state which is substantially the same as the state before the light irradiation. Therefore, the variation in electric characteristics of the transistor due to the light irradiation can be minimized.

Further, since the transistor in which electric characteristics are stabilized by minimizing its variation as described above can be realized, the reliability of the transistor including an oxide semiconductor can be improved. As a result, a display device in which a reduction in display quality is suppressed even when light irradiation is performed can be provided.

Embodiment 2

In this embodiment, an example of a transistor which can be applied to the display device disclosed in this specification will be shown. There is no particular limitation on the structure of the transistor which can be applied to the display device disclosed in this specification and; for example, a staggered type transistor or a planar type transistor having a top gate structure or a bottom gate structure can be employed. Further, the transistor may have a single gate structure including one channel formation region, a double gate structure including two channel formation regions, or a triple gate structure including three channel formation regions. Alternatively, the transistor may have a dual gate structure including two gate electrode layers positioned over and below a channel region with a gate insulating layer provided therebetween. Note that FIGS. 6A to 6D each show an example of a cross-sectional structure of the transistor. Each of the transistors illustrated in FIGS. 6A to 6D includes an oxide semiconductor as a semiconductor layer. An oxide semiconductor has advantages in high mobility and low off-state current, which can be obtained in a relatively easy and low-temperature process: however, it is needless to say that another semiconductor may be used as the semiconductor layer.

Figure 6A:
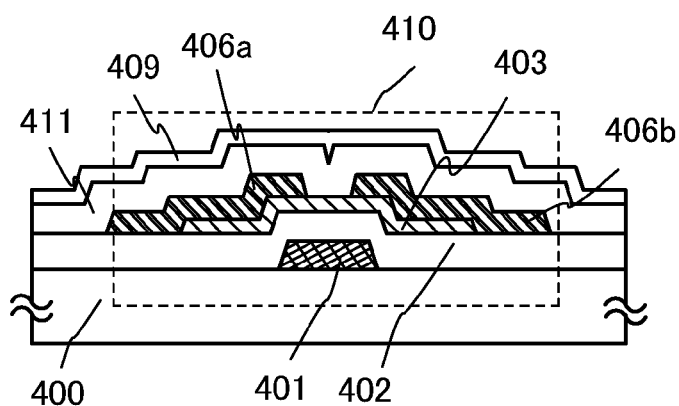
FIGS. 6A to 6D each illustrate a cross-sectional structure of a transistor.

A transistor 410 illustrated in FIG. 6A is one of bottom gate thin film transistors and is also referred to as an inverted staggered thin film transistor.

The transistor 410 includes, over a substrate 400 having an insulating surface, a gate electrode layer 401, a gate insulating layer 402, an oxide semiconductor layer 403, a source electrode layer 406a, and a drain electrode layer 406b. In addition, an insulating layer 411 which covers the transistor 410 and is stacked over the oxide semiconductor layer 403 is provided. A protective insulating layer 409 is provided over the insulating layer 411.

Figure 6B:
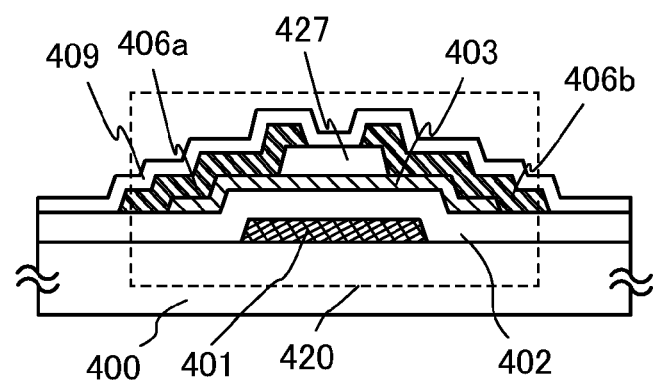

A transistor 420 illustrated in FIG. 6B is one of bottom-gate transistors referred to as channel-protective (channel-stop or etch-stop typed) transistors and is also referred to as an inverted staggered thin film transistor.

The transistor 420 includes, over a substrate 400 having an insulating surface, a gate electrode layer 401, a gate insulating layer 402, an oxide semiconductor layer 403, a source electrode layer 406a, a drain electrode layer 406b, and an insulating layer 427 as a channel protective layer, which covers a channel formation region of the oxide semiconductor layer 403. Further, a protective insulating layer 409 is formed so as to cover the transistor 420.

Figure 6C:
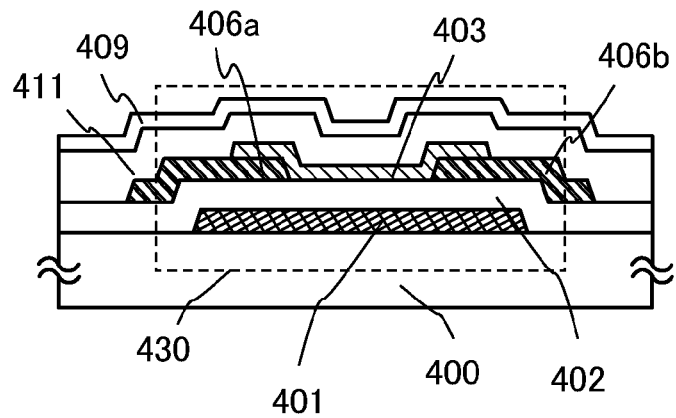

A transistor 430 illustrated in FIG. 6C is a bottom-gate thin film transistor, and includes, over a substrate 400 having an insulating surface, a gate electrode layer 401, a gate insulating layer 402, a source electrode layer 406a, a drain electrode layer 406b, and an oxide semiconductor layer 403. An insulating layer 411 which covers the transistor 430 and is in contact with the oxide semiconductor layer 403 is provided. A protective insulating layer 409 is provided over the insulating layer 411.

In the transistor 430, the gate insulating layer 402 is provided on and in contact with the substrate 400 and the gate electrode layer 401, and the source electrode layer 406a and the drain electrode layer 406b are provided on and in contact with the gate insulating layer 402. Further, the oxide semiconductor layer 403 is provided over the gate insulating layer 402, the source electrode layer 406a, and the drain electrode layer 406b.

Figure 6D:
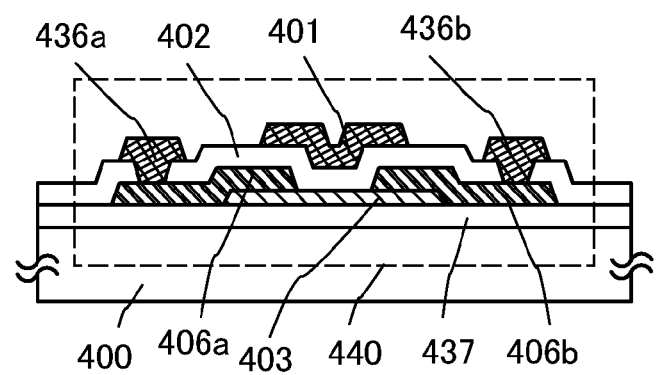

A transistor 440 illustrated in FIG. 6D is one of top-gate thin film transistors. The transistor 440 includes, over a substrate 400 having an insulating surface, an insulating layer 437, an oxide semiconductor layer 403, a source electrode layer 406a, a drain electrode layer 406b, a gate insulating layer 402, and a gate electrode layer 401. A wiring layer 436a and a wiring layer 436b are provided to be in contact with and electrically connected to the source electrode layer 406a and the drain electrode layer 406b, respectively.

In this embodiment, as described above, the oxide semiconductor layer 403 is used as a semiconductor layer. An oxide semiconductor to be used for the oxide semiconductor layer 403 preferably includes at least indium (In) or zinc (Zn). In particular, In and Zn are preferably included. As a stabilizer for reducing variation in electric characteristics of a transistor including the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer.

As the oxide semiconductor, for example, any of the following can be used: indium oxide; tin oxide; zinc oxide; a two-component metal oxide such as an In—Zn-based oxide, a Sn—Ga—Zn-based oxide, an Al—Ga—Zn-based oxide, a Sn—Al—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In: Ga: Zn. The In—Ga—Zn-based oxide may contain a metal element other than the In, Ga, and Zn.

For example, an In—Ga—Zn-based oxide with an atomic ratio of In: Ga: Zn=1:1:1 (=1/3:1/3:1/3) or In: Ga: Zn=2:2:1 (=2/5:2/5:1/5), or an oxide with an atomic ratio close to the above atomic ratios may be used. Alternatively, an In—Sn—Zn-based oxide with an atomic ratio of In: Sn: Zn=1:1:1 (=1/3:1/3:1/3), In: Sn: Zn=2:1:3 (=1/3:1/6:1/2), or In: Sn: Zn=2:1:5 (=1/4:1/8:5/8), or an oxide with an atomic ratio close to the above atomic ratios may be used.

However, the composition is not limited to those described above, and a material having the appropriate composition may be used depending on semiconductor characteristics to be needed (mobility, threshold value, variation, and the like). In order to obtain semiconductor characteristics to be needed, it is preferable that the carrier density, the impurity concentration, the defect density, the atomic ratio of a metal element to oxygen, the interatomic distance, the density, and the like be set to be appropriate.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In the transistors 410, 420, 430, and 440 each including the oxide semiconductor layer 403, a current in an off-state (off-state current) can be reduced. Therefore, an electrical signal of image data and the like can be held for a longer period of time, so that a writing interval can be set longer. Accordingly, frequency of refresh operation can be reduced, which leads to an advantageous effect of suppressing power consumption.

Further, in the transistors 410, 420, 430, and 440 each including the oxide semiconductor layer 403, relatively high field-effect mobility can be obtained, whereby high-speed operation is possible. Therefore, by using any of the transistors in a pixel portion of a display device, high-quality image can be provided.

Although there is no particular limitation on a substrate used for the substrate 400 having an insulating surface, a glass substrate of barium borosilicate glass, aluminoborosilicate glass, or the like can be used.

In the bottom-gate transistors 410, 420, and 430, an insulating film serving as a base film may be provided between the substrate 400 and the gate electrode layer 401. The base film has a function of preventing diffusion of an impurity element from the substrate 400, and can be formed to have a single-layer structure or a stacked-layer structure using one or more of a silicon nitride film, a silicon oxide film, a silicon nitride oxide film, and a silicon oxynitride film.

The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

The gate insulating layer 402 can be formed to have a single-layer or stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, by a plasma CVD method, a silicon nitride layer ($SiN_y$ (y >0)) with a thickness of greater than or equal to 50 nm and less than or equal to 200 nm is formed as a first gate insulating layer, and a silicon oxide layer ($SiO_x$ (x>0)) with a thickness of greater than or equal to 5 nm and less than or equal to 300 nm is formed as a second gate insulating layer over the first gate insulating layer, so that a gate insulating layer with a total thickness of 200 nm can be formed.

The source electrode layer 406a and the drain electrode layer 406b can be formed using an element selected from Al, Cr, Cu, Ta, Ti, Mo, and W, an alloy film containing any of these elements, an alloy film containing a combination of any of these elements, or the like. Alternatively, a structure may be employed in which a high-melting-point metal layer of Ti, Mo, W, or the like is stacked over one or both of the upper side and the lower side of a metal layer of Al, Cu, or the like. In addition, heat resistance can be improved by using an Al material to which an element (Si, Nd, Sc, or the like) which prevents generation of a hillock or a whisker in an Al film is added.

A material similar to that of the source electrode layer 406a and the drain electrode layer 406b can be used as the wiring layer 436a and the wiring layer 436b which are connected to the source electrode layer 406a and the drain electrode layer 406b, respectively.

Alternatively, the source electrode layer 406a and the drain electrode layer 406b (including a wiring layer formed in the same layer as the source electrode layer 406a and the drain electrode layer 406b) may be formed using conductive metal oxide. As the conductive metal oxide, indium oxide ($In_2O_3$), tin oxide ($SnO_2$), zinc oxide (ZnO), an alloy of indium and tin oxide ($In_2O_3$—$SnO_2$, which is abbreviated to ITO), an alloy of indium and zinc oxide ($In_2O_3$—ZnO), or any of these metal oxide materials in which silicon oxide is contained can be used.

As the insulating layers 411, 427, and 437, typically, an inorganic insulating film such as a silicon oxide film, a silicon oxynitride film, an aluminum oxide film, or an aluminum oxynitride film can be used.

As the protective insulating layer 409, an inorganic insulating film such as a silicon nitride film, an aluminum nitride film, a silicon nitride oxide film, or an aluminum nitride oxide film can be used.

In addition, a planarization insulating film may be formed over the protective insulating layer 409. As the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed using these materials.

Thus, in this embodiment, a high-performance display device can be provided by using a transistor including an oxide semiconductor layer.

Embodiment 3

In this embodiment, the case where a transistor using the driving method disclosed in this specification is applied to an electronic device will be described with reference to FIGS. 8A to 8C. In this embodiment, the case where the transistor using the driving method disclosed in this specification is applied to electronic devices such as a mobile phone set (also referred to as a mobile phone or a mobile phone device), electronic paper, and a projector will be described; however, the application of the transistor is not limited thereto. For example, it is needless to say that the transistor can be applied to any one of a variety of electronic devices such as a portable information terminal (including a portable game machine, an audio reproducing device, and the like), a camera such as a digital camera and a digital video camera, a television device (also referred to as a television or a television receiver), a personal computer, a car navigation system, an electronic notebook, and a touch panel.

Figure 8A:
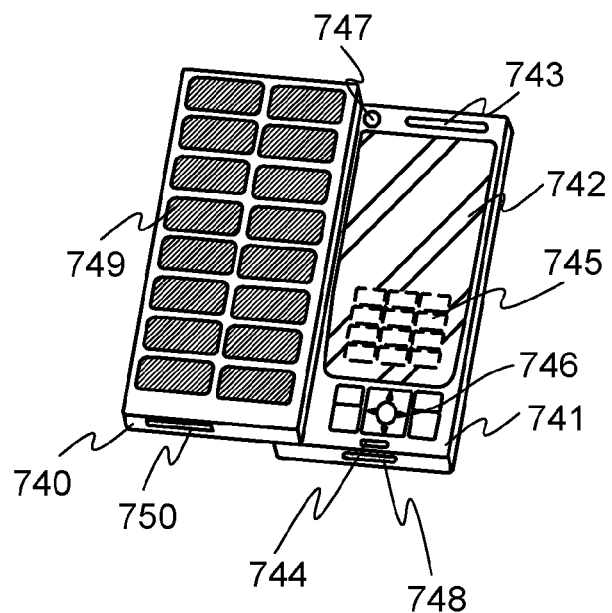
FIGS. 8A to 8C each show an example of an electronic device.

FIG. 8A illustrates a mobile phone set including two housings of a housing 740 and a housing 741. The housing 740 and the housing 741 developed as illustrated in FIG. 8A can shift by sliding so that one is lapped over the other; therefore, the size of the mobile phone set can be reduced, which makes the mobile phone suitable for being carried. The housing 741 is provided with a display panel 742, a speaker 743, a microphone 744, a pointing device 746, a camera lens 747, an external connection terminal 748, and the like. The housing 740 is provided with a solar cell 749 for charging the mobile phone set, an external memory slot 750, an optical sensor 751, and the like. An antenna is incorporated in the housing 741. In at least one of the housing 740 and the housing 741, the transistor including an oxide semiconductor which is described in the above embodiments is included. The threshold voltage of the transistor, which has fluctuated due to light irradiation, can be brought to the state which is substantially the same as the state before the light irradiation by applying a positive bias voltage to the gate electrode of the transistor for longer than or equal to 10 msec, preferably shorter than 10 msec. In addition, the optical sensor 751 which is mounted on the mobile phone set can detect turning on or off of light; therefore, a positive bias voltage can be applied to the gate electrode of the transistor including an oxide semiconductor at a timing when the transistor is certainly not irradiated with light. Note that the power source of the optical sensor 751 may be turned on or off as needed. Therefore, variation in electric characteristics due to light irradiation is minimized and a reduction in display quality is suppressed. Accordingly, a mobile phone set in which the reliability is sufficiently improved can be realized.

Figure 8B:
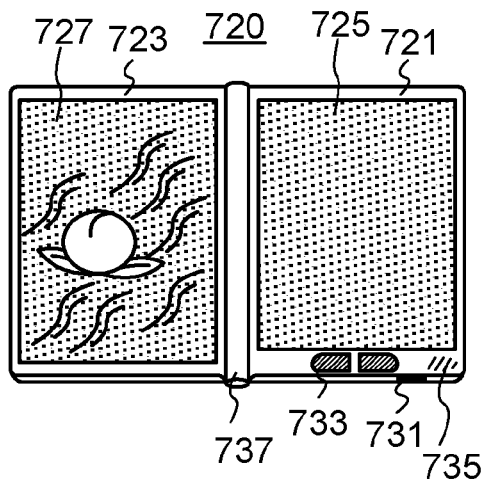

FIG. 8B illustrates an e-book reader 720 including electronic paper, and the e-book reader 720 includes two housings of a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power switch 731, an operation key 733, a speaker 735, an optical sensor 739, and the like. In at least one of the housing 721 and the housing 723, the transistor including an oxide semiconductor which is described in the above embodiments is included.

Regardless of whether the e-book reader 720 is not in use or in use, the threshold voltage of the transistor, which has fluctuated due to light irradiation, can be brought to the state which is substantially the same as the state before the light irradiation by applying a positive bias voltage to the gate electrode of the transistor for longer than or equal to 10 msec, preferably shorter than 10 msec when the transistor is in an off-state. When the transistor is in an off-state, it includes the following cases: the case where the display portion 725 and the display portion 727 are in a break period; the case where black images are displayed in the display portion 725 and the display portion 727; and the case where an animation or the like is automatically displayed in the display portion 725 and the display portion 727 without an input and output operation for a certain period in the e-book reader 720. Note that although the transistor is basically shielded from light, in some cases, the oxide semiconductor of the transistor is irradiated with light regardless of on or off of the e-book reader 720 due to some light leakage. However, since the optical sensor 739 which is mounted on the e-book reader 720 can detect turning on or off of light, a positive bias voltage can be applied to the gate electrode of the transistor at a timing when the oxide semiconductor is certainly not irradiated with light. Note that the power source of the optical sensor 739 may be turned on or off as needed. Therefore, variation in electric characteristics due to light irradiation is minimized and a reduction in display quality is suppressed. Accordingly, an e-book reader in which the reliability is sufficiently improved can be realized.

Figure 8C:
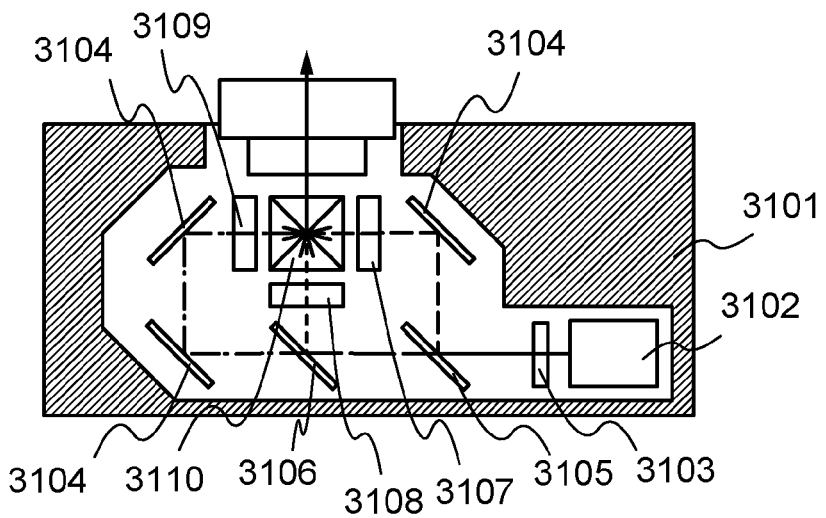

FIG. 8C illustrates a projector including, in a housing 3101, a light source 3102, a polarizing converter 3103 (PLC), a plurality of reflecting mirrors 3104, a red light reflecting dichroic mirror 3105, a green light reflecting dichroic mirror 3106, a red light transmissive liquid crystal panel 3107, a green light transmissive liquid crystal panel 3108, a blue light transmissive liquid crystal panel 3109, a cross dichroic prism 3110, a shutter 3111, and the like. Although not illustrated, the projector also includes an optical system for adjusting the amount of incident light and the focus. A detection circuit included in the projector can detect the amount of incident light so as to correspond to the light irradiation time of the light source. The light irradiation time is proportional to the amount of incident light.

The red light transmissive liquid crystal panel 3107, the green light transmissive liquid crystal panel 3108, and the blue light transmissive liquid crystal panel 3109 each include the transistor including an oxide semiconductor layer described in the above embodiments. The transistor is incorporated in each of the red light transmissive liquid crystal panel 3107, the green light transmissive liquid crystal panel 3108, and the blue light transmissive liquid crystal panel 3109. Further, a pixel including an image sensor (photodiode) is provided in at least one of pixels of the red light transmissive liquid crystal panel 3107. In a similar manner, a pixel including a photodiode is provided in at least one of pixels of the green light transmissive liquid crystal panel 3108, and a pixel including a photodiode is provided in at least one of pixels of the blue light transmissive liquid crystal panel 3109. Note that the photodiode may be driven or not as needed.

Figure 11:
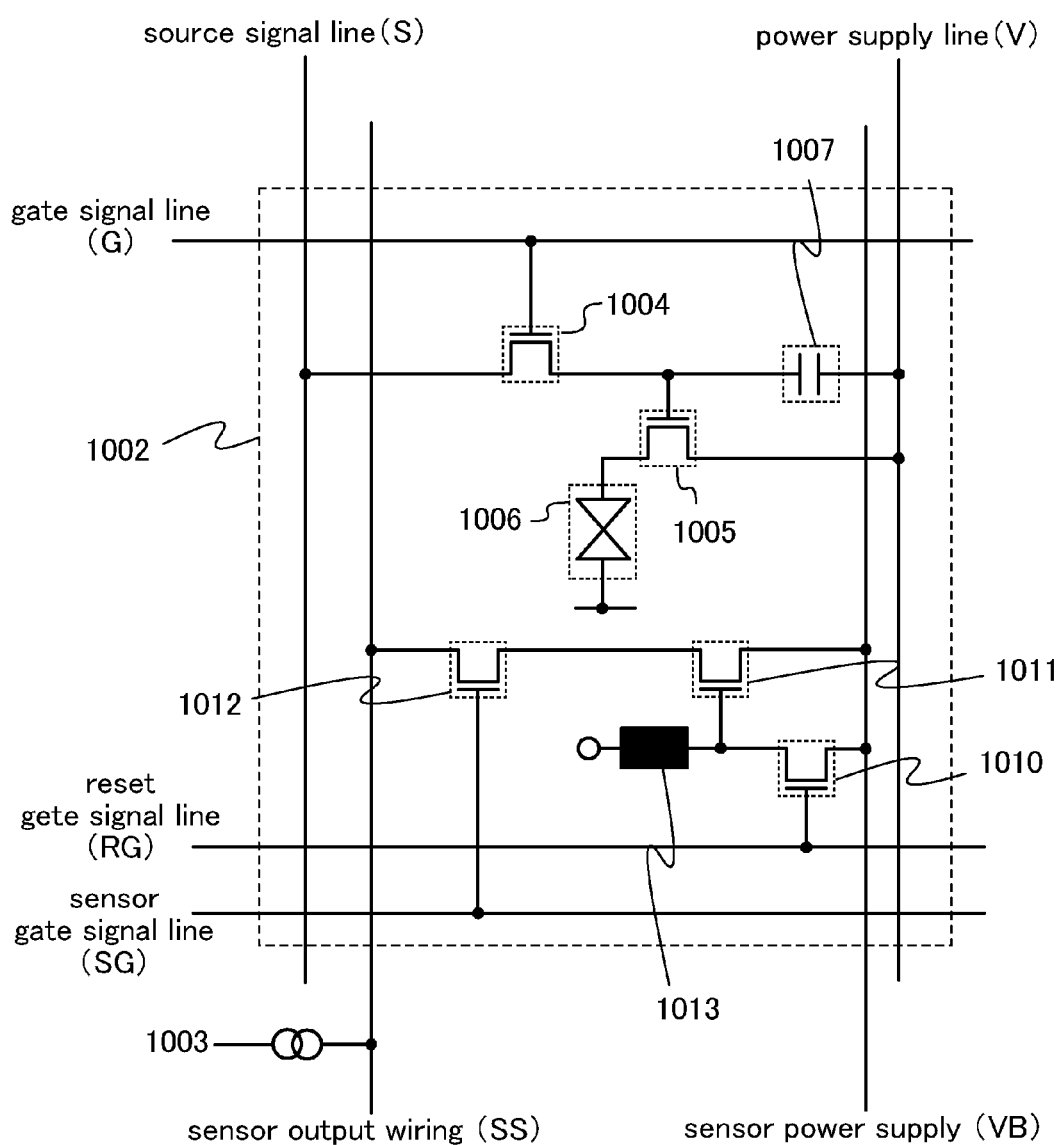
FIG. 11 is a diagram showing an example of a circuit diagram of a pixel.

FIG. 11 illustrates a detailed configuration of a pixel 1002 in which a photodiode is incorporated. A region surrounded with a dotted line is the pixel 1002. The pixel 1002 includes a switching TFT 1004, a TFT 1005 for driving liquid crystal, and a liquid crystal element 1006. Although a capacitor 1007 is provided in the pixel 1002 in FIG. 11, the capacitor 1007 is not necessarily provided.

A gate electrode of the switching TFT 1004 is connected to a gate signal line G. One of a source region and a drain region of the switching TFT 1004 is connected to a source signal line S, and the other is connected to a gate electrode of the TFT 1005 for driving liquid crystal.

A source region of the TFT 1005 for driving liquid crystal is connected to a power supply line V, and a drain region of the TFT 1005 for driving liquid crystal is connected to the liquid crystal element 1006. The capacitor 1007 is connected to the gate electrode of the TFT 1005 for driving liquid crystal and the power supply line V.

Further, the pixel 1002 includes a reset TFT 1010, a buffer TFT 1011, a selection TFT 1012, and a photodiode 1013.

A gate electrode of the reset TFT 1010 is connected to a reset gate signal line RG. A source region of the reset TFT 1010 is connected to a sensor power supply line VB. The sensor power supply line VB is always kept at a constant potential (reference potential). A drain region of the reset TFT 1010 is connected to the photodiode 1013 and a gate electrode of the buffer TFT 1011.

A drain region of the buffer TFT 1011 is connected to the sensor power supply line VB, which is always kept at a constant reference potential. A source region of the buffer TFT 1011 is connected to a source region or a drain region of the selection TFT 1012. A gate electrode of the selection TFT 1012 is connected to a sensor gate signal line SG. One of the source region and the drain region of the selection TFT 1012 is connected to the source region of the buffer TFT 1011 as described above, and the other is connected to a sensor output wiring SS. The sensor output wiring SS is connected to a constant current supply 1003, through which constant current always flows.

Although not illustrated in FIG. 11, the photodiode 1013 includes an n-type semiconductor layer, a p-type semiconductor layer, and a photoelectric conversion layer provided between the n-type semiconductor layer and the p-type semiconductor layer. Specifically, the drain region of the reset TFT 1010 is connected to the p-type semiconductor layer or the n-type semiconductor layer of the photodiode 1013.

Note that the shutter 3111 illustrated in FIG. 8C, which functions as a light-shielding unit that can be opened and closed, is provided adjacent to the polarizing converter 3103 (PLC), and is provided to refresh the transistor including an oxide semiconductor by shielding the transistor from light emitted from the light source 3102. When the projector is turned on and the shutter 3111 is opened, the red light transmissive liquid crystal panel 3107, the green light transmissive liquid crystal panel 3108, and the blue light transmissive liquid crystal panel 3109 are continuously irradiated with light emitted from the light source 3102 through the red light reflecting dichroic mirror 3105, the green light reflecting dichroic mirror 3106, and the like. Note that when the projector is turned on and the shutter 3111 is closed or when the projector is turned off, the transistor is basically shielded from light. Thus, when the shutter 3111 is closed even when the projector is in use, the threshold voltage of the transistor, which has varied due to light irradiation, can be brought to the state which is substantially the same as the state before the light irradiation by applying a positive bias voltage to the gate electrode of the transistor for longer than or equal to 10 msec, preferably shorter than 10 msec. The projector can operate normally by being mounting with a circuit for refreshing the transistor in accordance with the timing when the shutter is opened or closed. In this embodiment, refreshing of the transistor means that that the threshold voltage of the transistor, which has varied due to light irradiation, is brought to the state which is substantially the same as the state before the light irradiation.

Note that the photodiode 1013 is incorporated in at least one of the pixels of each liquid crystal panel, whereby, even when light emitted from the light source 3102 or unexpected light due to some light leakage enters the red light transmissive liquid crystal panel 3107, the green light transmissive liquid crystal panel 3108, and the blue light transmissive liquid crystal panel 3109, the photodiode 1013 can certainly detect turning on or off of such light. Thus, a positive bias voltage can be applied to the gate electrode of the transistor at the timing when the oxide semiconductor is certainly not irradiated with light. Therefore, variation in electric characteristics due to light irradiation is minimized and a reduction in display quality is suppressed even when light irradiation is performed. Accordingly, a projector in which the reliability is sufficiently improved can be realized.

EXAMPLE 1

In this example, photoresponse characteristics in the case where application condition of a positive bias voltage which is applied to the gate electrode of the transistor described in Embodiment 1 as an example is changed will be described in more detail based on measurement results obtained by experiment.

Photoresponse characteristics between before and after light irradiation were measured by changing application time of a positive bias voltage. Note that the measurement conditions are similar to those described above in Embodiment 1; therefore, Embodiment 1 can be referred to for the details thereof.

The photoresponse characteristics were measured using the above transistor 310. FIGS. 7A to 7F show measurement results of the photoresponse characteristics (photocurrent-time characteristics) between before and after light irradiation. In each of FIGS. 7A to 7F, the vertical axis represents the value of photocurrent, and the horizontal axis represents time. Note that a bias voltage applied to the gate electrode of the transistor including an oxide semiconductor to be measured is +20 V, a bias voltage applied to the source electrode is 0 V, and a bias voltage applied to the drain electrode is 0.1 V. The measurement was performed by changing the application time of the positive bias voltage in the following 6 conditions: 500 msec; 100 msec; 10 msec; 1 msec; 100 μsec; and 10 μsec. FIG. 7A, FIG. 7B, FIG. 7C, FIG. 7D, FIG. 7E, and FIG. 7F show measurement results of photoresponse characteristics between before and after the light irradiation where the application time is 500 msec, 100 msec, 10 msec, 1 msec, 100 μsec, and 10 μsec, respectively.

Figure 7A:
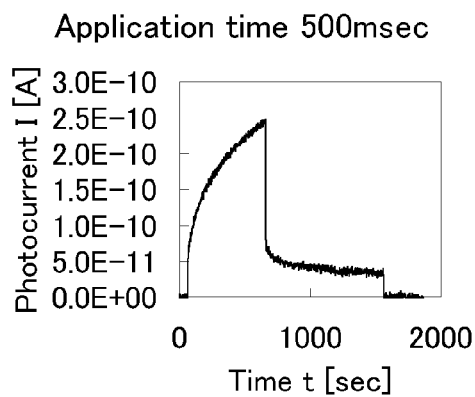
FIGS. 7A to 7F are graphs of photoresponse characteristics.
Figure 7B:
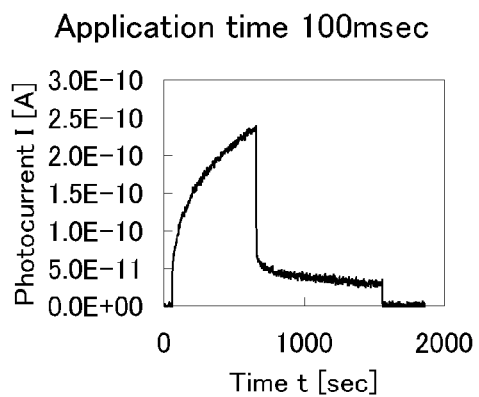
Figure 7C:
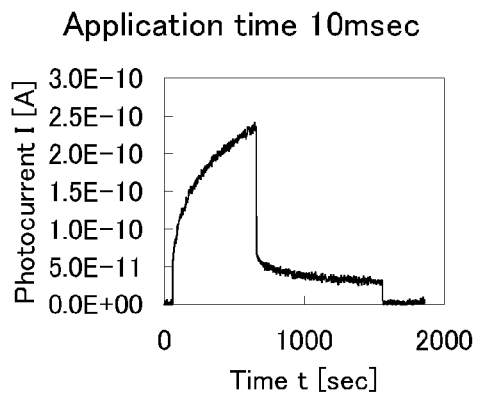

As shown in FIGS. 7A to 7C, that is, in the range where the application time was longer than or equal to 10 msec and shorter than or equal to 500 msec, the value of photocurrent after the application of the positive bias voltage was equivalent to the value of photocurrent before the light irradiation. Thus, it was found that the value of photocurrent after the light irradiation was brought to the value of photocurrent before the light irradiation as long as the application time was in the range of longer than or equal to 10 msec and shorter than or equal to 500 msec.

Figure 7D:
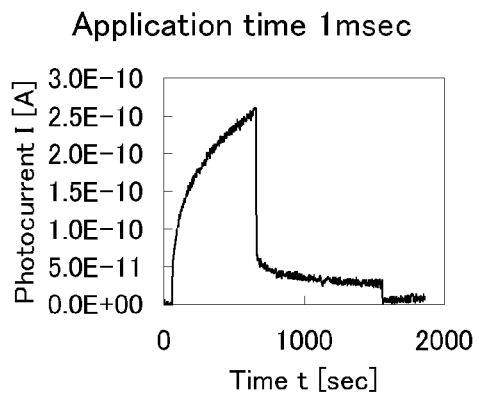

As shown in FIG. 7D, when the application time was 1 msec, the value of photocurrent after the application of the positive bias voltage differed from the value of photocurrent before the light irradiation, though the value of photocurrent after the application of the positive bias voltage was extremely small. That is, it was found that, when the application time was shorter than or equal to 1 msec, the value of photocurrent after the application of the positive bias voltage was hardly brought to the value of photocurrent before the light irradiation.

Figure 7E:
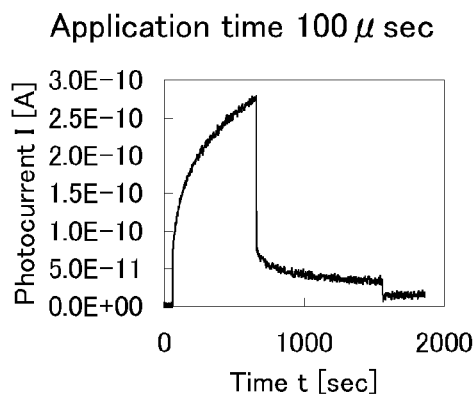

As shown in FIG. 7E, when the application time was 100 μsec, the value of photocurrent after the application of the positive bias voltage was larger than the value of photocurrent after the application for 1 msec. It was found that the difference between the value of photocurrent after the application of the positive bias voltage and the value of photocurrent before the light irradiation gradually widened over time and the effect at the second photoresponse had gradually become stronger than the effect obtained by application of the positive bias voltage.

Figure 7F:
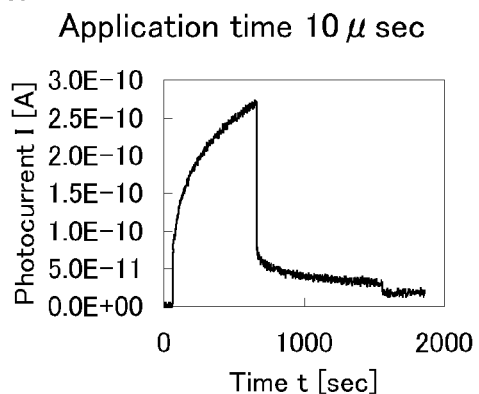

As shown in FIG. 7F, when the application time was 10 μsec, the value of photocurrent after the application of the positive bias voltage was larger than the value of photocurrent after the application for 100 μsec. It was found that the difference between the value of photocurrent after the application of the positive bias voltage and the value of photocurrent before the light irradiation further widened over time and the effect at the second photoresponse had become much stronger than the effect obtained by the application of the positive bias voltage.

Accordingly, it was found that the measurement results of the photoresponse characteristic changed between before and after the light irradiation by changing the application time of the positive bias voltage. As the length of the application time gets shorter, electric characteristics of the transistor become unstable. Thus, it was found that, in some cases, it was impossible to bring the electric characteristics of the transistor, which had varied due to the light irradiation, to the state before the light irradiation, even when a positive bias voltage was applied.

Further, it was found that, in the transistor in which electric characteristics had varied due to the light irradiation, the limit value of the time during which the positive bias voltage was applied to the gate electrode of the transistor was 1 msec, which was needed so that the electric characteristics were brought to the state which is substantially the same as the state before the light irradiation. In other words, when the application time is shorter than or equal to 1 msec, the effect at the second photoresponse which has been a factor for variation in electric characteristics of the transistor will be stronger than the effect obtained by application of the positive bias voltage.

Thus, it was found that, in the transistor in which electric characteristics had varied due to the light irradiation, the time during which the positive bias voltage was applied to the gate electrode of the transistor, which was needed so that the electric characteristics were brought to the state which is substantially the same as the state before the light irradiation, was an extremely important factor.

The above results revealed that, in order to suppress deterioration of electric characteristics due to light irradiation, application of a positive bias voltage for longer than or equal to 10 msec was important. Note that it is only necessary that the application time of a positive bias voltage be longer than or equal to 10 msec. In the case where the electric characteristics of the transistor might be varied due to the long time application of a positive bias voltage depending on the usage environment, the application time is preferably set to time during which the electric characteristics of the transistor is not varied, for example, 1 sec or shorter. Further, as the application voltage, not only +20 V but also a positive bias voltage of +0.1 V to +50 V can be used. Every time a positive bias voltage is applied, the electric characteristics of the transistor, which has varied due to the light irradiation, can be recovered to the state which is substantially the same as the state before the light irradiation as long as a positive bias voltage can be applied by the above method. In other words, the reliability of a transistor including an oxide semiconductor can be improved by minimizing the variation in electric characteristics. As a result, a display device in which a reduction in display quality is suppressed even when light irradiation is performed can be provided.

EXAMPLE 2

Figure 9:
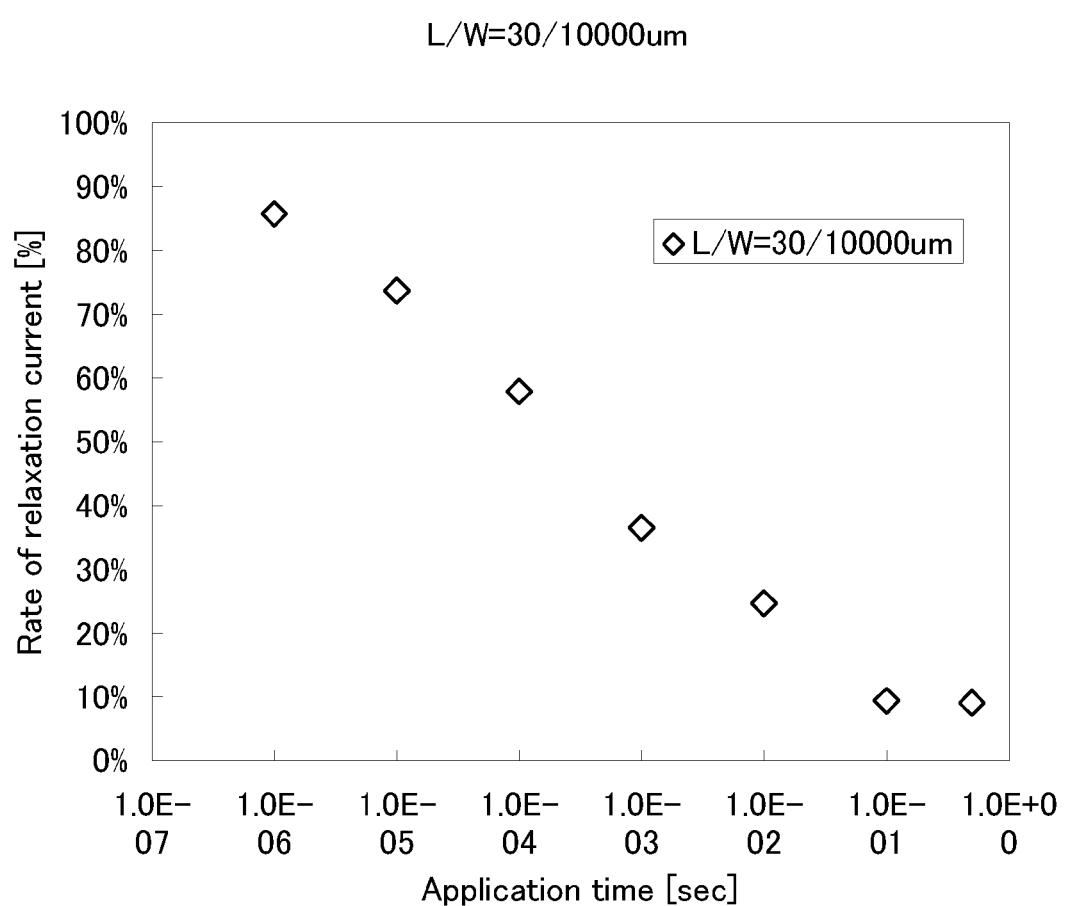
FIG. 9 is a graph of photoresponse characteristics.
Figure 10:
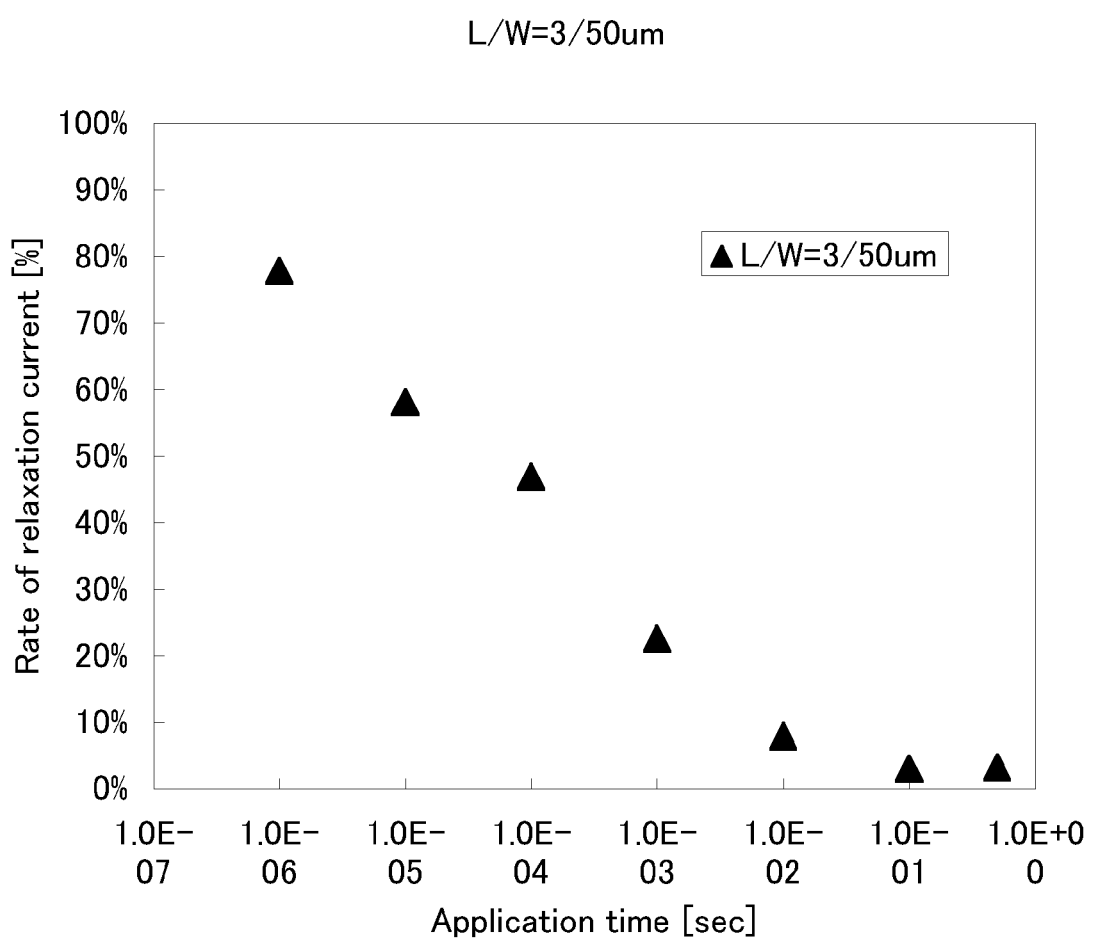
FIG. 10 is a graph of photoresponse characteristics.

In this example, the restoration rate of photocurrent will be described in more detail based on measurement results obtained by experiment. FIG. 9 and FIG. 10 each show measurement results of the rate of relaxation current per application time of a positive bias voltage, which is changed from 500 msec to 100 msec, 10 msec, 1 msec, 100 μsec, 10 μsec, and 1 μsec. Note that the vertical axis represents the rate of relaxation current, and the horizontal axis represents the application time. FIG. 9 shows the rate of relaxation current which is measured using a transistor (the transistor shown as an example in Embodiment 1 and Example 1) whose channel length (L) is 30 μm and whose channel width (W) is 10000 μm. FIG. 10 shows the rate of relaxation current which is measured using a transistor whose channel length (L) is 3 μm and whose channel width (W) is 50 μm.

Note that a bias voltage of +20 V is applied to a gate electrode of the transistor including an oxide semiconductor to be measured, and 0 V and 0.1 V are applied to the source electrode and the drain electrode, respectively. Note that the measurement conditions are similar to those described above in Example 1; therefore, Example 1 can be referred to for the details thereof.

Note that the restoration rate of photocurrent can be estimated from the rate of relaxation current. The rate of relaxation current can be obtained by the following equation: the relaxation current=(the value of photocurrent immediately after application of a positive bias voltage/the value of photocurrent immediately before application of a positive bias voltage). The larger the rate of relaxation current is, the worse the restoration rate of photocurrent is; and the smaller the rate of relaxation current is, the better the restoration rate of photocurrent is. For example, when the rate of relaxation current is 50% in this specification, it means that deterioration of electric characteristics of a transistor due to light irradiation can be suppressed by half.

As shown in FIG. 9, in the transistor whose channel length (L) is 30 μm and whose channel width (W) is 10000 μm, the rate of relaxation current is 57.9% when the application time is 100 μsec. As shown in FIG. 10, in the transistor whose channel length (L) is 3 μm and whose channel width (W) is 50 μm, the rate of relaxation current is 46.9% when the application time is 100 μsec. Note that there is no particular limitation on the channel length (L) and the channel width (W) of the transistor.

Further, as shown in FIG. 9, in the transistor whose channel length (L) is 30 μm and whose channel width (W) is 10000 μm, the rate of relaxation current is 24.7% when the application time is 10 msec. As shown in FIG. 10, in the transistor whose channel length (L) is 3 μm and whose channel width (W) is 50 μm, the rate of relaxation current is 7.93% when the application time is 10 msec.

Thus, it was found from FIG. 9 and FIG. 10 that the rate of relaxation current was approximately 50% when the time during which a positive bias voltage was applied to the gate electrode of the transistor including an oxide semiconductor was 100 μsec and deterioration of electric characteristics of the transistor due to light irradiation was able to be suppressed by half. Further, it was found that the rate of relaxation current was approximately 10% to 20% when the time during which a positive bias voltage was applied to the gate electrode of the transistor including an oxide semiconductor was 10 msec and the electric characteristics of the transistor, which had varied due to light irradiation, were able to be brought to the state which was substantially the same as the state before the light irradiation.

One embodiment of the present invention can be applied to a semiconductor device in which transistors which design a circuit can be irradiated with light, such as a display device including a lighting unit (e.g., a backlight), a display device including a light-emitting element, and a sensor device including an optical sensor and a signal processing circuit thereof.

This application is based on Japanese Patent Application serial No. 2010-248094 filed with the Japan Patent Office on Nov. 5, 2010, the entire contents of which are hereby incorporated by reference.

What is claimed is:

1. A semiconductor device comprising:
a transistor including an oxide semiconductor overlapping a gate electrode with a gate insulating layer interposed therebetween; and
a driving circuit configured to apply a positive voltage to the gate electrode for longer than or equal to 100 μsec.

2. The semiconductor device according to claim 1, wherein the positive voltage is applied to the gate electrode without applying a voltage to a source electrode and a drain electrode.

3. The semiconductor device according to claim 1, wherein the positive voltage is applied to the gate electrode when the transistor is in an off-state.

4. The semiconductor device according to claim 1, wherein the positive voltage is applied to the gate electrode when the transistor is shielded from light.

5. A semiconductor device comprising:
a transistor including an oxide semiconductor overlapping a gate electrode with a gate insulating layer interposed therebetween;
an optical sensor; and
a driving circuit configured to apply a positive voltage to the gate electrode for longer than or equal to 100 μsec.

6. The semiconductor device according to claim 5, wherein the positive voltage is applied to the gate electrode without applying a voltage to a source electrode and a drain electrode.

7. The semiconductor device according to claim 5, wherein the positive voltage is applied to the gate electrode when the transistor is in an off-state.

8. The semiconductor device according to claim 5, wherein the positive voltage is applied to the gate electrode when the transistor is shielded from light.

9. The semiconductor device according to claim 5, wherein the positive voltage is applied to the gate electrode when the optical sensor detects turning off of light.

10. The semiconductor device according to claim 5, wherein the positive voltage is applied to the gate electrode when the optical sensor detects turning on of light.

11. The semiconductor device according to claim 5, wherein the positive voltage is applied to the gate electrode when the optical sensor detects turning off of light which includes an energy higher than or equal to a band gap of the oxide semiconductor.

12. The semiconductor device according to claim 5, wherein the positive voltage is applied to the gate electrode when the optical sensor detects turning on of light which includes an energy higher than or equal to a band gap of the oxide semiconductor.

13. A method for driving a transistor comprising the steps of:
    irradiating with light a transistor which includes an oxide semiconductor overlapping a gate electrode with a gate insulating layer interposed therebetween, so that a threshold voltage is shifted to a negative direction; and
    applying a positive voltage to the gate electrode for longer than or equal to 100 μsec, so that the threshold voltage is brought to a state substantially the same as a threshold voltage before the light irradiation.

14. The method for driving a transistor according to claim 13, wherein the positive voltage is applied to the gate electrode without applying a voltage to a source electrode and a drain electrode.

15. A method for driving a transistor comprising the steps of:
    irradiating with light a transistor which includes an oxide semiconductor overlapping a gate electrode with a gate insulating layer interposed therebetween, so that a threshold voltage is shifted to a negative direction; and
    applying a positive voltage to the gate electrode for longer than or equal to 100 μsec when the transistor is in an off-state, so that the threshold voltage is brought to a state substantially the same as a threshold voltage before the light irradiation.

16. The method for driving a transistor according to claim 15, wherein the positive voltage is applied to the gate electrode without applying a voltage to a source electrode and a drain electrode.

17. A method for driving a transistor comprising the steps of:
    irradiating with light a transistor which includes an oxide semiconductor overlapping a gate electrode with a gate insulating layer interposed therebetween, so that a threshold voltage is shifted to a negative direction; and
    applying a positive voltage to the gate electrode for longer than or equal to 100 μsec when the transistor is shielded from the light, so that the threshold voltage is brought to a state substantially the same as a threshold voltage before the light irradiation.

18. The method for driving a transistor according to claim 17, wherein the positive voltage is applied to the gate electrode without applying a voltage to a source electrode and a drain electrode.

* * * * *